United States Patent [19]
Houser et al.

[11] 3,989,178
[45] Nov. 2, 1976

[54] WIRE MAZE PENETRATING APPARATUS

[75] Inventors: David Erle Houser, Apalachin; Kenneth John Lubert, Endicott; Richard Jay Morenus, Endwell, all of N.Y.

[73] Assignee: International Business Machines Corporation, Armonk, N.Y.

[22] Filed: Dec. 11, 1975

[21] Appl. No.: 639,951

[52] U.S. Cl. .............................. 228/4.5; 29/203 B; 228/5.1
[51] Int. Cl.² ......................................... H05K 3/32
[58] Field of Search ................... 228/4.5, 57, 5.1; 29/203 R, 203 B, 203 H, 203 HM; 254/133

[56] References Cited
UNITED STATES PATENTS

| | | | |
|---|---|---|---|
| 2,850,737 | 9/1958 | Walsh | 29/203 B |
| 3,425,114 | 2/1969 | Fellenzer, Jr. | 29/203 HM |
| 3,734,386 | 5/1973 | Hazel | 228/4.5 |

OTHER PUBLICATIONS

Steranko, "High–Density Bonding Tweezers," IBM Technical Disclosure Bulletin, vol. 10, No. 5, pp. 630–631 (1967).

*Primary Examiner*—Al Lawrence Smith
*Assistant Examiner*—K. J. Ramsey
*Attorney, Agent, or Firm*—Cyril A. Krenzer

[57] ABSTRACT

Apparatus operative in conjunction with a wire routing and bonding machine, or the like, to selectively penetrate a maze of parallel wires on a printed circuit board and expose an area on the board so that additional wires may be suitably bonded to the exposed area. Utilizing the pressure it experiences when contacting the board surface, the apparatus operates to avoid damage to the printed circuit board surface and at the same time has a high reliability for clearing of wires from the selected area.

7 Claims, 5 Drawing Figures

WIRE MAZE PENETRATING APPARATUS

CROSS-REFERENCE TO RELATED APPLICATIONS

The apparatus of this invention could be utilized in the system shown and described in co-pending application Ser. No. 493,371, filed July 31, 1974, entitled "Fine Wire Twisted Pair Routing and Connection System", filed in the name of Herbert Kenneth Hazel, which application is also assigned to IBM Corporation.

BACKGROUND OF THE INVENTION

1. Field of the Invention

This invention relates to apparatus for selectively exposing an area on a printed circuit board, for example, to permit the bonding of wire or the like to said exposed area.

2. Prior Art

With the advent of high density wiring on printed circuit boards, for reasons of economy and reliability, it is desirable to utilize automatic wiring apparatus to route wires from a feeding unit for bonding between selected points on the printed circuit board surface. The apparatus may bond either single or multiple stands of wire, and in the above-referenced, co-pending application, for example, there is particular emphasis placed on automatic routing and bonding of pairs of twisted wire.

One of the difficulties encountered in using such automatic wiring apparatus is that as the number of wires connected on a side of a printed circuit board increases (increased wiring density) the bonding sites for the wires become covered by previously routed wires. This is particularly significant where the wires are constrained to flow in rows and columns with the result that there may be a very large number of wires covering particular bonding sites.

Typical of the prior art solutions to the problem of clearing the area to which a wire is to be bonded is shown in the article entitled "High Density Bonding Tweezers" by J. J. Steranko found in the IBM Technical Disclosure Bulletin, Vol. 10, No. 5, October 1967 on pages 630 and 631. According to this, a sheath in the form of a pair of tweezers is used to probe toward the selected contact area. As the bonding site was contacted, the tweezer pairs are moved apart to spread any covering wires and to permit a bonding head to move into contact with the wire to make an ultrasonic bond. The difficulty with this wire maze penetrating device was that it is not readily susceptible to automation, but rather requires manual activation to assure that all of the wires are cleared from the bonding site area in a manner which will not cause damage to the board.

In providing automatic maze penetrating apparatus, it is necessary that enough pressure be provided to accomplish penetration of the wires on the board and spreading thereof, while at the same time preventing any damage to the board surface. If, for example, an automated wire routing mechanism included a maze penetrating apparatus which always descended a prescribed distance from a fixed reference, because of the warpage that exists in a board and the variations in a boards thickness, it is possible that either the maze penetrating tip may pierce the board surface and rupture it as it spreads to clear the defined area or in the alternative, the maze penetrating apparatus may not penetrate all the wires on the surface of the board, so that as the spreading of the tips occurs, some wires remain over the bonding area.

OBJECTS AND SUMMARY OF THE INVENTION

It is, therefore, a principal object of this invention to provide wire maze penetrating apparatus which overcomes the foregoing disadvantages of the prior art.

It is another object of this invention to provide a wire maze penetrating apparatus which can be automatically positioned and activated in a reliable efficient manner.

It is still a further object of this invention to provide a wire maze penetrating apparatus which is operative to reliably clear a bonding site, while at the same time avoiding any damage thereto.

According to one aspect of the invention, a wire maze penetrating apparatus includes a pair of penetrating needles mounted on an automatic routing apparatus with the needles symmetric about a bonding center line. The needles are subject to pressure activation as they contact the board surface, with the pressure being controlled so that the slight pressure caused by contact with the wires over the surface of the board does not affect spreading of the needles, yet such that when the printed circuit board position is located, the pressure of the board on the needles cause the needles to spread thereby clearing the area to which the bond is to be made.

According to another aspect of the invention, the needles rather than being symmetrically adjusted about the center line, are set with one needle lower and across the other needle in a manner such that as the board area contacts the maze penetrating apparatus, a small center area of the bonding site is swept first by the lower needle in one direction and then by the higher needle in the opposite direction to assure complete removal of all wires from the bonding site.

The foregoing and other objects, features and advantages of the invention will be apparent from the following more particular description of the preferred embodiments of the invention, as illustrated in the accompanying drawings.

DETAILED DESCRIPTION OF THE PREFERRED EMBODIMENTS

Figure 1:
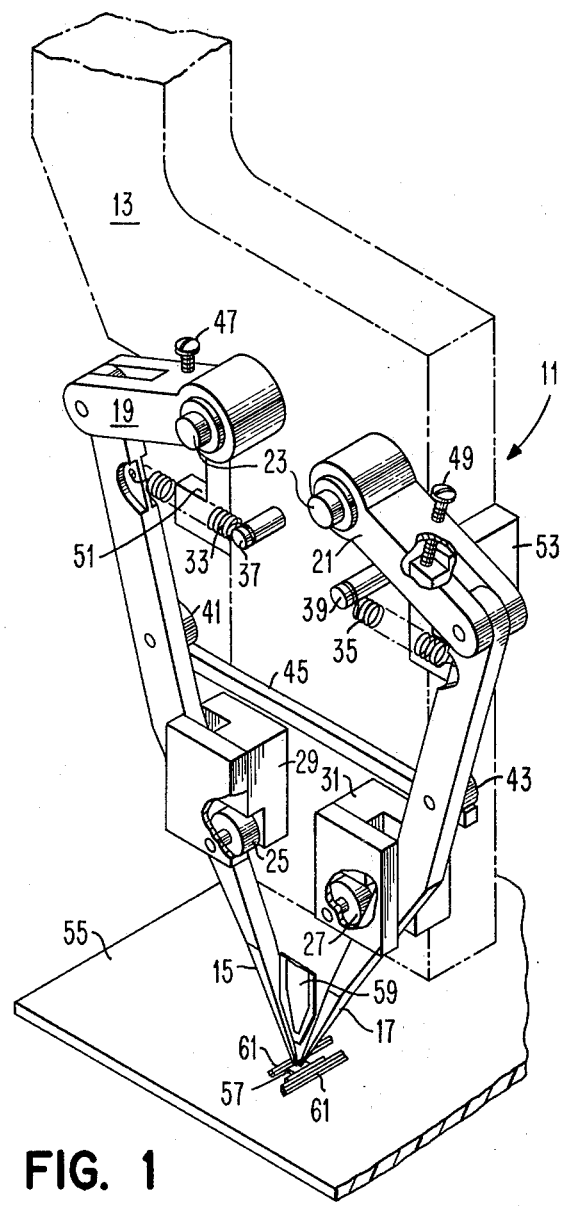
FIG. 1 is a perspective view, partially in section, of one embodiment of wire maze penetrating apparatus according to the present invention.

Referring to FIG. 1, the apparatus generally indicated as 11 includes a mounting member 13 which could be suitably affixed, for example, to the wire routing apparatus shown in FIG. 1 of the above-referenced patent application Ser. No. 493,371, filed July 31, 1974. A pair of penetrating needles 15 and 17 are linked to clevis bars 19 and 21, respectively. The clevis bars are free to rotate on ball bearings or the like which are mounted on pins 23 which connect the clevis bars to the support member 13. The lower inside edge of the needles 15, 17 ride against ball bearings 25 and 27, respectively, which are mounted in block assemblies 29 and 31 suitably connected to the support member 13. The block assemblies have open slip fit slots operative to restrict the lateral movements of the needles to a fixed plane. Extension springs 33 and 35 are connected between the upper needle arms 15 and 17, respectively, and support pins 37 and 39, respectively.

Also attached about the mid-portion of the needles 15 and 17 are lift rollers 41 and 43, respectively. Included with the mechanism is a lift bar 45 which may be movably operated by a suitable lift assembly (not shown). Mounted on and through the upper clevis bars 19 and 21 are adjustable stop screws 47 and 49 which are adapted to contact stop bars 51 and 53, respectively. As shown in FIG. 1, the entire mechanism is located above a portion of a printed circuit board 55 so that the tips of the needles 15 and 17 are approximate an area 57 to which a bond is to be made. Located between the needles 15 and 17 is shown a fragmentary portion of a bonding mechanism 59.

Figure 2:
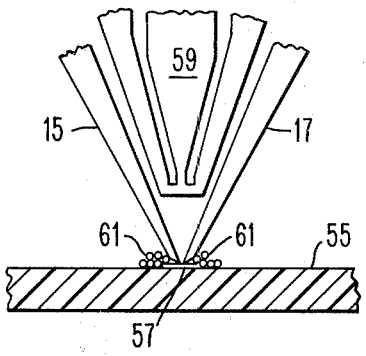
FIG. 2 is an enlarged frontal view of the needle tips portion of the wire maze penetrating apparatus of FIG. 1.
Figure 3:
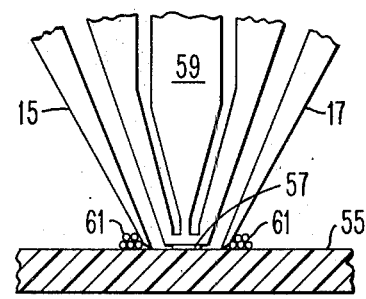
FIG. 3 is another view of the portion of the wire maze penetrating apparatus shown in FIG. 2.

In operation, it will be assumed that the device 11 has been suitably positioned above the area or bonding site 57 on the printed circuit board 55 and that it is desired to separate the bundle of wires 61 covering the area 57 so that the bonding tip may be placed in contact therewith to suitably bond to it a wire (not shown). Prior to making contact with the surface of the printed circuit board, the extension springs 33 and 35 will hold the needles 15 and 17 in their normal down position tangent to the bearings 25 and 27, respectively. In the down position, the stop screws 47 and 49 are resting on the stop blocks 51 and 53 and the tips of the two needles 15 and 17 are touching. Initially, the printed circuit board 55 is located some distance below the needles, so that the tips of the needles are well above the wire maze 61. To initiate operation, the board is raised to a position as shown in FIG. 2 so that the board surface contacts the tips of the needles after the needles penetrate the wire maze 61. As the board is raised slightly higher, the needles constrained by slots in the blocks 29 and 31 move laterally against the bias of springs 33 and 35 about the pivot arms on the clevis bars 19 and 21, respectively, thereby producing a sweeping action of the needles across the board surface to further separate the two portions of the wire bundles 61 as shown in FIG. 3. It is the pivotal action of the clevis bars 19 and 21 with the needles 15 and 17, coupled with the restraining action of the bearings 25 and 27 mounted in the mounting blocks 29 and 31 which results in this preferred lateral opening motion of the needles 15 and 17. Then as shown in FIG. 3, the tip of the bonding mechanism 59 is brought into contact with the area 57 permitting a bond to be made thereto. Typically this will be a wire or pair of wires (not shown).

The bar 45 operating in conjunction with the rollers 41 and 43 of the mechanism of FIG. 1 permits retraction of the needle tips even though no pressure is being applied to them. For example, after the wire bond is made to the circuit board, it is desired that the board may be then lowered without the needle scraping over the just completed bond. This is accomplished by raising the bar 45 to contact the rollers 41 and 43, thereby retaining the retraction of the tips of the needles 15 and 17, even though the board exerts no pressure on them. Once the bonding mechanism has cleared the surface of the circuit board, the bar 45 can be lowered to bring the tips of the needles 15 and 17 into their normally closed position. There may exist other situations in which it is desired to retract the tips of the needles 15 and 17 absent pressure thereon, such as for example, to clear other components mounted on the printed circuit board as the bonding mechanism is routed from one bond site to another.

Figure 4:
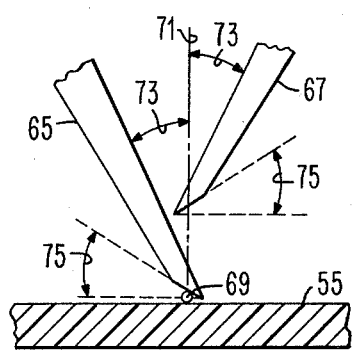
FIG. 4 is a front view of a preferred embodiment of the positioning of the needles of the wire maze penetrating apparatus according to the present invention.

A preferred positioning of the needles 15 and 17 is shown in FIG. 4. By suitably adjusting the stop screws 47 and 49, the needles can be readjusted so that in their normally closed positions, the needle 65 lies lower and under the needle 67. This nonsymmetric positioning of the needles 65 and 67 may be desired to ensure that all areas on the printed circuit board are swept by one needle or the other so that any wire in the wire maze 61 which is located in the exact center of the area 57 will be removed from the area to be bonded. As can be seen, using the configuration of FIG. 4, the needle 65 would first contact the surface of the board and sweep to the left. Subsequently, the needle 67 would contact an overlapping portion of the circuit board and sweep it to the right, thereby assuring that any centrally located wire 69 in the wire maze is moved from the area to which a bond is to be made. Obviously, either needle can be located in the lower position.

FIG. 4 also shows additional features of a preferred embodiment of the needle arms according to the present invention. Both arms 65 and 67 are positioned about a center line 71 with equal angular displacement 73 therefrom. A reasonable value for the angle 73 is between 20° and 25°. Also illustrated is the angular feature 75 of the tips of the needles 65 and 67. By having the tips formed to be at an angle 75 of approximately 30° with the horizontal, that is, the plane of the printed circuit board 55, the chance of any damage to the surface of the printed circuit board is further minimized.

While not shown, the springs 33 and 35 can include tensioning adjustments, to permit adjustment of the relative pressures required to affect the separation and sweeping motion of the needles 15 and 17 as the apparatus is brought in contact with the printed circuit board. By suitably adjusting the tension, the desired relative pressures can be established assuring a highly reliable penetration of any wire maze on the circuit board, yet in a manner such that the pressure of the needles on the board will not cause damage to the board surface.

Figure 5:
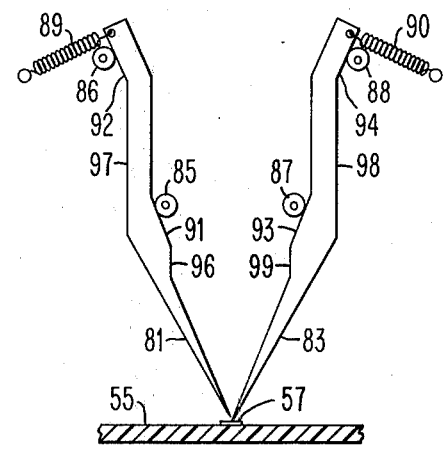
FIG. 5 is a partial perspective view of another embodiment of wire maze penetrating apparatus according to the present invention.

FIG. 5 depicts an alternate functional embodiment showing only a perspective view of the penetrating needles 81 and 83 with associated support rollers 85, 86, 87 and 88 together with biasing springs 89 and 90. The mechanism is shown in the normal position before penetration of wires on the board 55 occurs. The biasing springs 89, 90 hold the needles 81, 83 against positive stops (not shown) and tangent to the rollers 85, 86, 87 and 88. The rollers 85 and 86 associated with penetrating needle 81 contact slanted surfaces 91 and 92, respectively, and rollers 87 and 88 associated with needle 83 contact surfaces 93 and 94, respectively, of that needle. As can be seen in FIG. 5, surface 91 is parallel with surface 92, and similarly, surface 93 is parallel with surface 94. Thus as the printed circuit board 55 rises and contacts the tips of the needles 81, 83, the needles move up and are spread by the action of the rollers 85, 86, 87 and 88 until the rollers move off of the surfaces 91, 92, 93 and 94. After the rollers move off of these slanted surfaces, they come into contact with the vertical surfaces 96, 97, 98 and 99. Because these latter surfaces are vertical, further vertical motion of the circuit board results only in vertical motion of the needle tips without any further spreading thereof. Thus, the tips spread only as far as is necessary to accomplish the maze penetration, regardless of the amount of board warpage that might exist. This advantageously minimizes damage to any previously installed wires on the surface of the printed circuit board.

While the invention has been particularly shown and described with reference to preferred embodiments thereof, it will be understood by those skilled in the art that various changes in form and details may be made therein without departing from the spirit and scope of the invention.

We claim:

1. Wire maze penetrating apparatus operative to remove wires from and open an area on a printed circuit board surface to permit the bonding of additional wire to the board surface, said apparatus comprising:

a pair of needle-like penetrating members each connected to a support member at one end, with the other ends of said penetrating members normally proximate each other;

means operative to position said apparatus above the area on the printed circuit board to which a bond is to be made;

means operative to bring said penetrating members into contact with the surface of the printed circuit board; and pressure responsive apparatus connected to said support member and said penetrating members operative in response to pressure exerted on said penetrating members by said board surface to cause said penetrating members to spread apart and thereby open an area on said board surface.

2. Wire maze penetrating apparatus operative to penetrate a bundle of wires on the surface of a printed circuit board and to open an area on said board surface to permit the bonding of additional wire to the area on the board surface said apparatus comprising:

a pair of needle like penetrating members each connected to a support member at one end with the other needle-like end of said penetrating members normally proximate each other, said pair of penetrating members being symmetrically disposed about a central axis;

means operative to bring said penetrating members into contact with the surface of a printed circuit board; and pressure responsive apparatus connected to said needle-like penetrating members and said support member, said pressure responsive apparatus being operative in response to pressure exerted on said penetrating members by said board surface to spread across the board surface and thereby open an area on said board surface.

3. The invention according to claim 2, wherein said pressure responsive apparatus for each of said penetrating members comprises:

a clevis bar attached to the top of said penetrating member;

means connecting said clevis bar to said support member, whereby said clevis bar is free to rotate about a point on the means connected to said support member;

a block assembly connected to said support member, said block assembly including a slot having a bearing therein, said slot operative to constrain the movement of said penetrating member to a predetermined plane; and biasing means connected between said support means and said penetrating member.

4. The invention according to claim 3 wherein said apparatus additionally comprises an adjustable screw member mounted in each of said clevis bars, each screw member operative to establish the relative position of the needle-like portion of its respective penetrating members.

5. The invention according to claim 2 wherein a first of said penetrating members is disposed beneath the second of said penetrating members, both of said members being equi-angularly disposed about a central axis.

6. The invention according to claim 2 wherein the tips of each of said penetrating members is formed to provide a flat surface at an angle of approximately 30° with a horizontal plane.

7. The invention according to claim 2, wherein said pressure responsive apparatus of each of said penetrating members comprises:

first and second angularly formed surfaces disposed on opposite sides of said member, one above the other, but approximately parallel to each other;

first and second substantially vertical surfaces disposed, respectively, below and contacting said first and second angularly formed surfaces respectively;

first and second roller means normally in contact with said angularly formed surfaces; and biasing means connected between said support means and said penetrating member, whereby said penetrating member is normally maintained in a downward position and is responsive to pressure on the tip of said member to slide up and outward on said roller means.

* * * * *